(12) United States Patent
Zhang et al.

(10) Patent No.: US 8,912,933 B1
(45) Date of Patent: *Dec. 16, 2014

(54) SERIALIZER WITH MULTIPLE STAGES

(75) Inventors: Fulong Zhang, Cupertino, CA (US); Ling Wang, San Jose, CA (US); John Schadt, Bethlehem, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 239 days.

This patent is subject to a terminal disclaimer.

(21) Appl. No.: 13/616,173

(22) Filed: Sep. 14, 2012

Related U.S. Application Data

(63) Continuation of application No. 12/987,393, filed on Jan. 10, 2011, now Pat. No. 8,274,412.

(51) Int. Cl.
*H03M 9/00* (2006.01)

(52) U.S. Cl.
CPC ...................................... *H03M 9/00* (2013.01)

USPC .......................................................... 341/101

(58) Field of Classification Search
CPC ........................................................ H03M 9/00
USPC .................................................. 341/100, 101
See application file for complete search history.

(56) References Cited

U.S. PATENT DOCUMENTS

| | | | | |
|---|---|---|---|---|
| 7,091,890 B1 * | 8/2006 | Sasaki et al. | ................... | 341/100 |
| 7,372,381 B2 * | 5/2008 | Chan | ............................. | 341/100 |
| 2004/0165617 A1 * | 8/2004 | Wu et al. | ........................ | 370/476 |
| 2007/0030184 A1 * | 2/2007 | Nguyen et al. | ................ | 341/100 |

\* cited by examiner

*Primary Examiner* — Howard Williams

(57) ABSTRACT

In certain embodiments of the invention, a serializer has a transfer stage that transfers N-bit parallel data from a relatively slow timing domain to a relatively fast timing domain and a serializing stage that converts the parallel data into serialized data. Between the transfer stage and the serializing stage is an update stage that buffers the data and can be used to toggle the serializer between an N−1 operating mode and an N+1 operating mode.

20 Claims, 7 Drawing Sheets

TABLE I

| TIME PERIOD | t0-t1 | t1-t2 | t2-t3 | t3-t4 | t4-t5 | t5-t6 | t6-t7 | t7-t8 |
|---|---|---|---|---|---|---|---|---|
| UPDATE_0 | 0 | 0 | 1 | 1 | 0 | 0 | 0 | 0 |
| UPDATE_1 | 0 | 0 | 0 | 0 | 1 | 1 | 0 | 0 |
| SEL | 0 | 0 | 0 | 0 | 0 | 0 | 1 | 1 |
| tx0 | D0_0 | D0_0 | D0_0 | D0_0 | D0_0 | D0_0 | D0_0 | D1_0 |
| tx1 | D0_1 | D0_1 | D0_1 | D0_1 | D0_1 | D0_1 | D0_1 | D1_1 |
| tx2 | D0_2 | D0_2 | D0_2 | D0_2 | D0_2 | D0_2 | D0_2 | D1_2 |
| tx3 | D0_3 | D0_3 | D0_3 | D0_3 | D0_3 | D0_3 | D0_3 | D1_3 |
| tx4 | D0_4 | D0_4 | D0_4 | D0_4 | D0_4 | D0_4 | D0_4 | D1_4 |
| tx5 | D0_5 | D0_5 | D0_5 | D0_5 | D0_5 | D0_5 | D0_5 | D1_5 |
| tx6 | D0_6 | D0_6 | D0_6 | D0_6 | D0_6 | D0_6 | D0_6 | D1_6 |
| tx7 | * | * | * | * | * | * | * | * |
| u0 | * | * | * | D0_0 | D0_0 | D0_0 | D0_0 | D0_0 |
| u1 | * | * | * | D0_1 | D0_1 | D0_1 | D0_1 | D0_1 |
| u2 | * | * | * | D0_2 | D0_2 | D0_2 | D0_2 | D0_2 |
| u3 | * | * | * | D0_3 | D0_3 | D0_3 | D0_3 | D0_3 |
| u4 | * | * | * | D0_4 | D0_4 | D0_4 | D0_4 | D0_4 |
| u5 | * | * | * | D0_5 | D0_5 | D0_5 | D0_5 | D0_5 |
| u6 | * | * | * | D0_6 | D0_6 | D0_6 | D0_6 | D0_6 |
| u7 | * | * | * | * | * | * | * | * |
| s0 | * | * | * | * | * | D0_0 | D0_0 | D0_0 |
| s1 | * | * | * | * | * | D0_1 | D0_1 | D0_1 |
| s2 | * | * | * | * | * | D0_2 | D0_2 | D0_2 |
| s3 | * | * | * | * | * | D0_3 | D0_3 | D0_3 |
| s4 | * | * | * | * | * | D0_4 | D0_4 | D0_4 |
| s5 | * | * | * | * | * | D0_5 | D0_5 | D0_5 |
| s6 | * | * | * | * | * | D0_6 | D0_6 | D0_6 |
| s7 | * | * | * | * | * | * | * | * |
| TX_OUT | * | * | * | * | * | D0_0 | D0_0 | D0_1 |
| TIME PERIOD | t0-t1 | t1-t2 | t2-t3 | t3-t4 | t4-t5 | t5-t6 | t6-t7 | t7-t8 |

*FIG. 5 cont.*

TABLE I continued

| t8-t9 | t9-t10 | t10-t11 | t11-t12 | t12-t13 | t13-t14 | t14-t15 | t15-t16 | t16-17 | t17-t18 |
|---|---|---|---|---|---|---|---|---|---|
| 0 | 1 | 1 | 1 | 0 | 0 | 0 | 0 | 0 | 0 |
| 0 | 0 | 0 | 0 | 1 | 1 | 1 | 0 | 0 | 0 |
| 1 | 1 | 1 | 1 | 1 | 1 | 1 | 0 | 0 | 0 |
| | | | | | | | | | |
| D1_0 | D1_0 | D1_0 | D1_0 | D1_0 | D1_0 | D1_0 | D1_0 | D1_0 | D2_0 |
| D1_1 | D1_1 | D1_1 | D1_1 | D1_1 | D1_1 | D1_1 | D1_1 | D1_1 | D2_1 |
| D1_2 | D1_2 | D1_2 | D1_2 | D1_2 | D1_2 | D1_2 | D1_2 | D1_2 | D2_2 |
| D1_3 | D1_3 | D1_3 | D1_3 | D1_3 | D1_3 | D1_3 | D1_3 | D1_3 | D2_3 |
| D1_4 | D1_4 | D1_4 | D1_4 | D1_4 | D1_4 | D1_4 | D1_4 | D1_4 | D2_4 |
| D1_5 | D1_5 | D1_5 | D1_5 | D1_5 | D1_5 | D1_5 | D1_5 | D1_5 | D2_5 |
| D1_6 | D1_6 | D1_6 | D1_6 | D1_6 | D1_6 | D1_6 | D1_6 | D1_6 | D2_6 |
| * | * | * | * | * | * | * | * | * | * |
| | | | | | | | | | |
| D0_0 | D0_0 | D0_0 | D0_6 | D0_6 | D0_6 | D0_6 | D0_6 | D0_6 | D0_6 |
| D0_1 | D0_1 | D0_1 | D1_0 | D1_0 | D1_0 | D1_0 | D1_0 | D1_0 | D1_0 |
| D0_2 | D0_2 | D0_2 | D1_1 | D1_1 | D1_1 | D1_1 | D1_1 | D1_1 | D1_1 |
| D0_3 | D0_3 | D0_3 | D1_2 | D1_2 | D1_2 | D1_2 | D1_2 | D1_2 | D1_2 |
| D0_4 | D0_4 | D0_4 | D1_3 | D1_3 | D1_3 | D1_3 | D1_3 | D1_3 | D1_3 |
| D0_5 | D0_5 | D0_5 | D1_4 | D1_4 | D1_4 | D1_4 | D1_4 | D1_4 | D1_4 |
| D0_6 | D0_6 | D0_6 | D1_5 | D1_5 | D1_5 | D1_5 | D1_5 | D1_5 | D1_5 |
| * | * | * | D1_6 | D1_6 | D1_6 | D1_6 | D1_6 | D1_6 | D1_6 |
| | | | | | | | | | |
| D0_2 | D0_2 | D0_2 | D0_4 | D0_4 | D0_4 | D0_6 | D0_6 | D0_6 | D1_1 |
| D0_3 | D0_3 | D0_3 | D0_5 | D0_5 | D0_5 | D1_0 | D1_0 | D1_0 | D1_2 |
| D0_4 | D0_4 | D0_4 | D0_6 | D0_6 | D0_6 | D1_1 | D1_1 | D1_1 | D1_3 |
| D0_5 | D0_5 | D0_5 | * | * | * | D1_2 | D1_2 | D1_2 | D1_4 |
| D0_6 | D0_6 | D0_6 | vss | vss | vss | D1_3 | D1_3 | D1_3 | D1_5 |
| * | * | * | vss | vss | vss | D1_4 | D1_4 | D1_4 | D1_6 |
| vss | vss | vss | vss | vss | vss | D1_5 | D1_5 | D1_5 | vss |
| vss | vss | vss | vss | vss | vss | D1_6 | D1_6 | D1_6 | vss |
| | | | | | | | | | |
| D0_2 | D0_2 | D0_3 | D0_4 | D0_4 | D0_5 | D0_6 | D0_6 | D1_0 | D1_1 |
| | | | | | | | | | |
| t8-t9 | t9-t10 | t10-t11 | t11-t12 | t12-t13 | t13-t14 | t14-t15 | t15-t16 | t16-17 | t17-t18 |

SERIALIZER WITH MULTIPLE STAGES

RELATED APPLICATION DATA

This application is a continuation of U.S. application Ser. No. 12/987,393, filed Jan. 10, 2011, which is incorporated herein by reference in its entirety.

TECHNICAL FIELD

The present invention relates generally to serializers for converting a parallel data stream to a serial data stream and, in particular, to serializers for programmable logic devices.

BACKGROUND

A programmable logic device, such as an FPGA, receives incoming data from external devices via input/output (I/O) interfaces on the FPGA, processes that data in its logic core, and transmits resulting, outgoing data to the same or other external devices via the same or other I/O interfaces. In some FPGAs, the speed of signaling between the FPGA and external devices is greater than the speed at which the FPGA's logic core operates. As such, such FPGAs are implemented with serializer/deserializer (SERDES) circuits having (i) de-serializers that receive and convert high-speed incoming serial data streams from external devices into lower-speed parallel data streams for processing by the logic core and (ii) serializers that receive and convert resulting lower-speed parallel data streams generated by the logic core into high-speed outgoing serial data streams for transmission to external devices.

Depending on the particular application, the serial data streams to and from an FPGA can have different word sizes (e.g., 4 bit, 7 bits, 8 bits). In order to avoid having to provide different SERDES circuits for each different word size, it is desirable to have the de-serializers and serializers in the FPGA's SERDES circuits be configurable (i.e., programmable) to selectively operate at any one of those different word sizes. For example, an FPGA designed to support any of 4-bit, 7-bit, and 8-bit word sizes should have (i) a de-serializer that can be configured to convert an incoming serial data stream having N-bit words into N parallel data streams and (ii) a serializer that can be configured to convert N resulting parallel data streams into an outgoing serial data stream having N-bit words, where N is any one of 4, 7, and 8. The term "gearing ratio" for a de-serializer or a serializer refers to the ratio between the number of parallel data streams and the single corresponding serial data stream. Thus, a de-serializer that processes N-bit words is said to have a 1:N gearing ratio, while a corresponding serializer is said to have an N:1 gearing ratio.

Traditionally, for de-serializers having odd gearing ratios, such as 1:7, a sampling clock is provided at the same rate as the high-speed incoming serial data stream, where single data rate (SDR) sampling is used to sample the incoming serial data, for example, at each rising edge of the high-speed sampling clock. Similarly, for traditional serializers having odd gearing ratios, such as 7:1, a sampling clock is provided at the same rate as the high-speed outgoing serial data stream, where SDR sampling is used to output another serial data bit, for example, at each rising edge of the high-speed sampling clock.

Another way to achieve a 7:1 odd gearing ratio is to employ a 4:1 even gearing ratio (which can be based on a slower sampling clock than the previously described SDR sampling clock) followed by 4:7 rate-conversion logic. Unfortunately, this extra rate-conversion step consumes a large amount of logic, resulting in both high silicon cost and high power consumption.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 5 shows Table I, which identifies the values for certain control and data signals during some of the time periods represented in FIG. 4.

DETAILED DESCRIPTION

Figure 1:
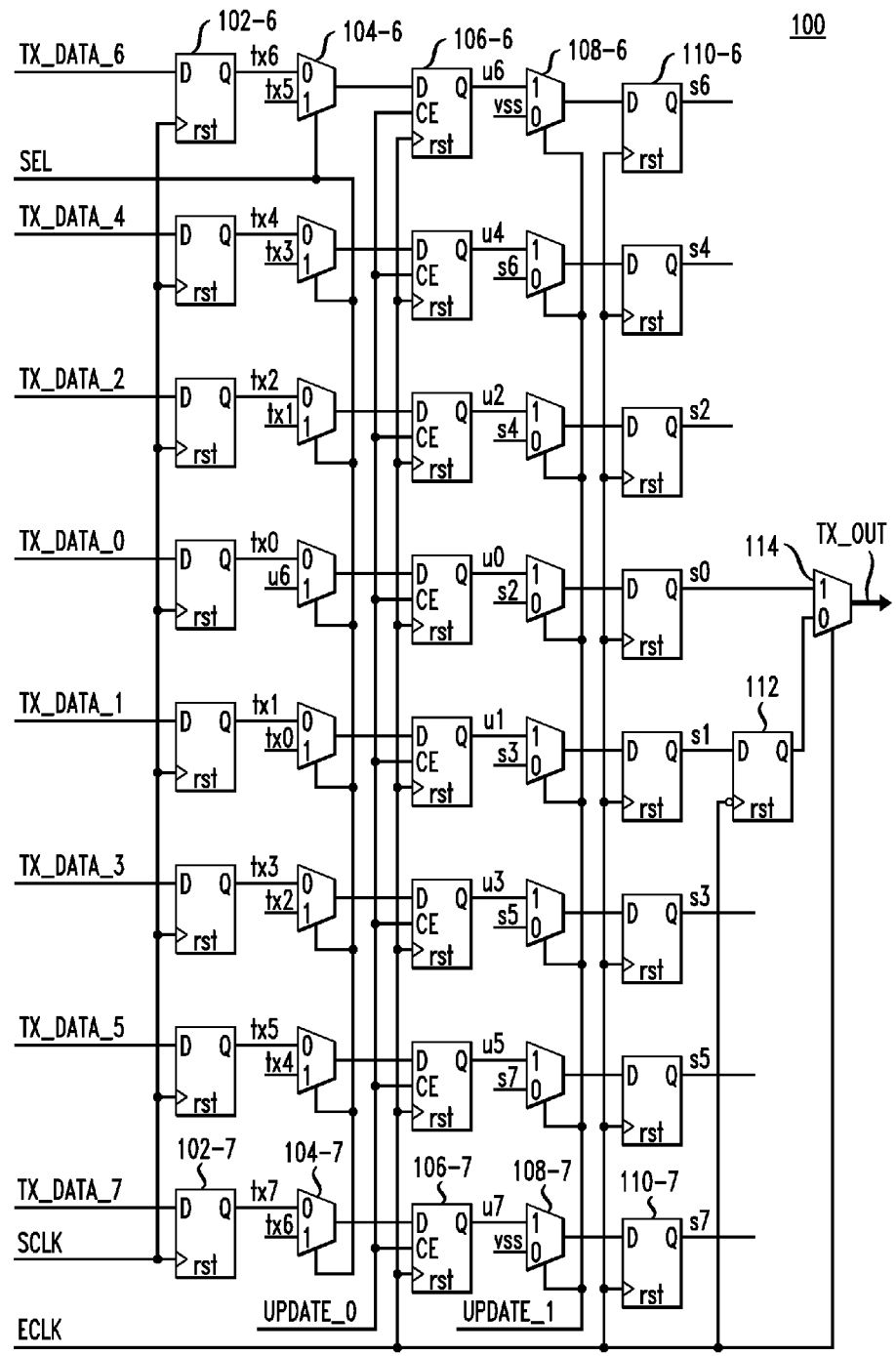
FIG. 1 shows a schematic block diagram of a serializer according to one embodiment of the present invention.
Figure 2:
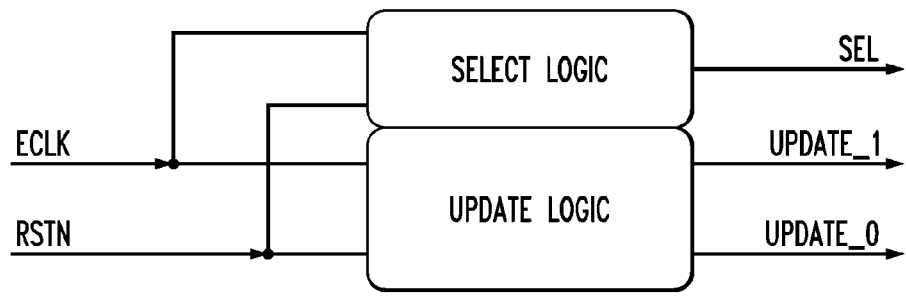
FIG. 2 shows a block diagram of a controller for controlling the operations of the serializer of FIG. 1.

FIG. 1 shows a schematic block diagram of a serializer 100, and FIG. 2 shows a block diagram of a controller 200 for dynamically controlling the operations of serializer 100, according to one embodiment of the present invention. In theory, serializer 100 can be selectively configured by controller 200 to operate as an N:1 serializer, where N is any number between 2 and 8, inclusive (i.e., 2#N#8). In one implementation, serializer 100 is part of a SERDES circuit of a programmable logic device, such as an FPGA.

In general, serializer 100 receives N low-speed parallel data streams at input ports TX_DATA_0 to TX_DATA (N−1) and outputs a single high-speed serial data stream at output port TX_OUT. Note that, when N<8, input ports TX_DATA_N to TX_DATA_7 are not used. For example, input port TX_DATA_7 is not used when serializer 100 is configured to operate as a 7:1 serializer (i.e., N=7). Controller 200 generates and applies three control signals SEL, UPDATE_0, and UPDATE_1 to control the operations of serializer 100. In addition to the N parallel data streams and the three control signals, serializer 100 also receives a relatively slow clock signal SCLK and a corresponding relatively fast clock signal ECLK, where ECLK is N/2 times faster than SCLK. In addition to fast clock ECLK, controller 200 receives a reset control signal RSTN that can be used to reset the operations of controller 200.

Referring to FIG. 1, serializer 100 comprises (i) an initial, transfer stage comprising eight transfer (flip-flop) registers 102, (ii) an intermediate, update stage comprising eight (2×1) update multiplexers (muxes) 104 and eight update (flip-flop) registers 106, and (iii) a final, serializing stage comprising eight (2×1) shift muxes 108, eight shift (flip-flop) registers 110, a falling-edge (flip-flop) register 112, and a (2×1) output mux 114.

As shown in FIG. 1, transfer registers 102 are triggered by the slow clock SCLK, while update registers 106, shift registers 110, and falling-edge register 112 are triggered by the fast clock ECLK. In addition, update muxes 104 are controlled by control signal SEL, update registers 106 are enabled by control signal UPDATE_0, shift muxes 108 are controlled by control signal UPDATE_1, and output mux 114 is controlled by the fast clock ECLK.

In particular, falling-edge register 112 is triggered by falling edges in fast clock ECLK, while the output from output mux 114 is controlled by the levels of fast clock ECLK. Thus, during each cycle of ECLK, output mux 114 presents two output bits: signal s0 during the first half of the cycle when ECLK is high and signal s1 during the second half of the cycle when ECLK is low. In this way, with shift registers 110 being triggered by rising edges in ECLK, and falling-edge register 112 being triggered by falling edges in ECLK, serializer 100 is able to serialize parallel data streams using DDR sampling.

As explained in detail below, transfer registers 102 form an initial, domain-transfer stage that functions to transfer incoming parallel data from the timing domain of slow clock SCLK to the timing domain of fast clock ECLK, and shift muxes 108 and shift registers 110 form a final, serializing stage that functions to convert the parallel data into serial data by sequentially shifting the parallel data towards output mux 114. Update muxes 104 enable serializer 100 to support odd gearing ratios in an efficient manner, while update registers 106 provide signal buffering between the initial, domain-transfer stage of transfer registers 102 and the final, serializing stage of shift muxes 108 and shift registers 110.

8:1 Gearing Ratio

Figure 3:
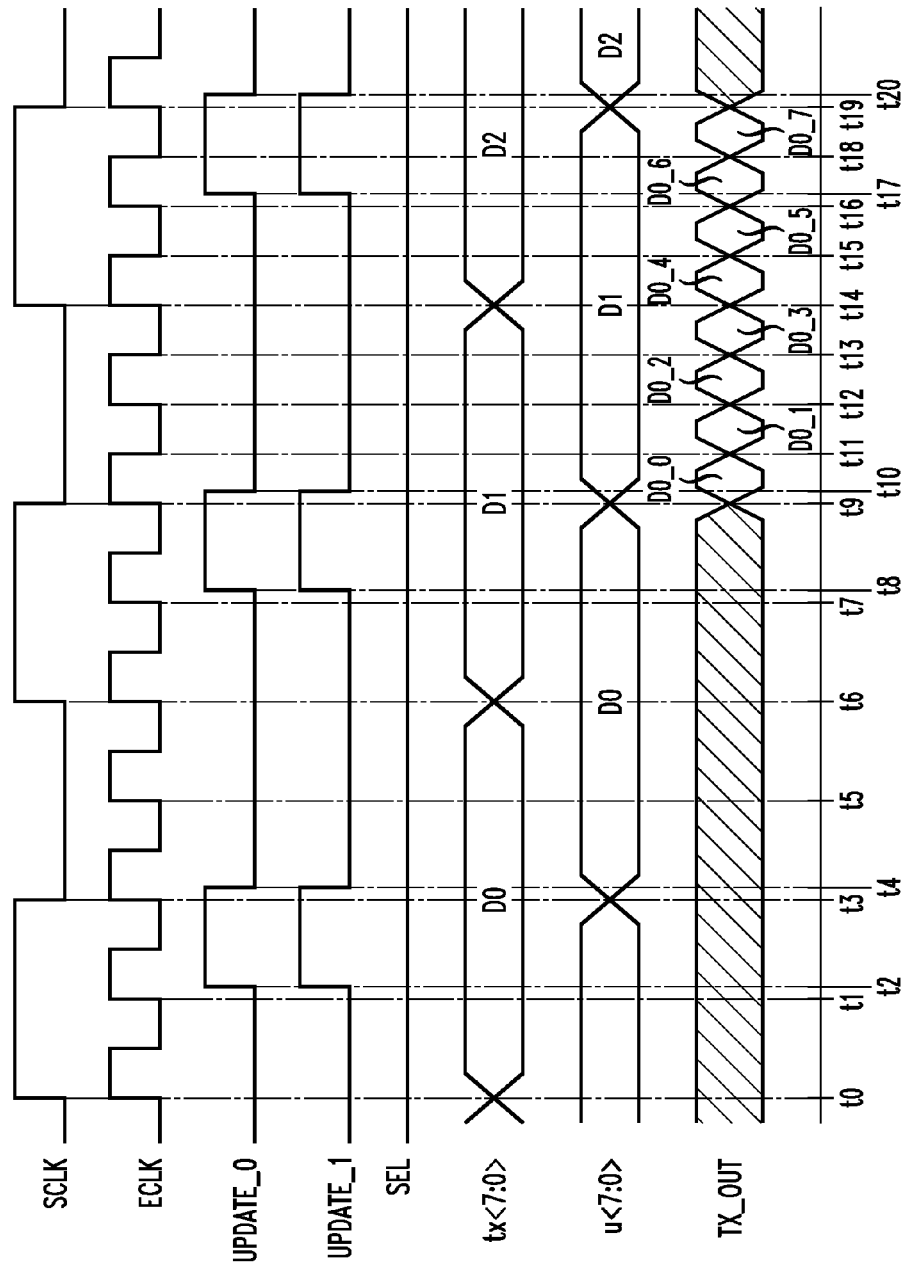
FIG. 3 shows a timing diagram representing some of the operations of the serializer of FIG. 1 when configured to operate as an 8:1 serializer.

FIG. 3 shows a timing diagram representing some of the operations of serializer 100 of FIG. 1 when configured to operate as an 8:1 serializer. For an 8:1 gearing ratio, eight parallel data streams are respectively applied to the eight input ports TX_DATA_0 to TX_DATA_7, and the fast clock ECLK is four times faster than the slow clock SCLK, as reflected in FIG. 3.

Note that, for the first 8-bit data word D0, the first parallel data bit applied at the first input port TX_DATA_0 (i.e., bit D0_0) will become the first serial data bit presented at output port TX_OUT, the corresponding first parallel data bit applied at the second input port TX_DATA_1 (i.e., bit D0_1) will become the second serial data bit presented at output port TX_OUT, and so on, such that the corresponding first parallel data bit applied at the eighth input port TX_DATA_7 (i.e., bit D0_7) will become the eighth serial data bit presented at output port TX_OUT. This pattern for the first 8-bit data word D0 repeats for each successive 8-bit data word D1, D2, etc. As represented in FIG. 3, the rising and falling edges of the pulses in control signals UPDATE_0 and UPDATE_1 are slightly delayed relative to the corresponding rising edges in fast clock ECLK. Thus, for example, UPDATE_0 and UPDATE_1 go high at time t2, which is slightly later than the rising edge of ECLK at time t1, and UPDATE_0 and UPDATE_1 go low at time t4, which is slightly later than the rising edge of ECLK at time t3. Similarly, UPDATE_0 and UPDATE_1 go high at time t8, which is slightly later than the rising edge of ECLK at time t7, and UPDATE_0 and UPDATE_1 go low at time t10, which is slightly later than the rising edge of ECLK at time t9.

As also shown in FIG. 3, control signal SEL is always low, which implies that each update mux 104 always outputs the data applied to its upper (0) input.

In FIG. 3, time line tx<7:0> indicates the time periods at which the different parallel data words D0, D1, D2 reach the Q output ports of transfer registers 102, while time line u<7:0> indicates the time periods at which those parallel data words reach the Q outputs of update registers 106, and time line TXOUT indicates the time periods at which the individual bits of the serialized data words reach output port TX_OUT.

At the first rising edge of SCLK at time t0 in FIG. 3, each transfer register 102 outputs the first data bit of its corresponding incoming parallel data stream to the upper input of its corresponding update mux 104, which in turn passes that first data bit to the data input port D of its corresponding update register 106. Thus, from time t0 to the next rising edge of SCLK at time t6, signal tx0 in FIG. 1 is bit D0_0, signal tx1 is bit D0_1, and so on, such that signal tx7 is bit D0_7.

At the next rising edge of ECLK at time t1, control signal UPDATE_0 is low, and update registers 106 are therefore disabled. Control signal UPDATE_0 goes high at time t2, thereby enabling update registers 106. As such, at the next rising edge of ECLK at time t3, update registers 106 output their D input data bits via their Q output data ports to the upper (1) data inputs of their corresponding shift muxes 108. At time t4, control signal UPDATE_0 goes low, thereby disabling update registers 106. Thus, from time t3 until time t9, signal u0 in FIG. 1 is bit D0_0, signal u1 is bit D0_1, and so on, such that signal u7 is bit D07.

From time t4 to time t8, control signal UPDATE_1 is low, causing shift muxes 108 to output their lower (0) data inputs. Thus, at the rising edges of ECLK at times t5, t6, and t7, shift registers 110 output data appearing at the lower inputs of shift muxes 108. When operations of serializer 100 begin, these particular data values are irrelevant.

At time t8, control signal UPDATE_1 goes high, causing shift muxes 108 to output their upper (1) data inputs (i.e., u0 to u7) to the data input ports D of shift registers 110. As such, at the next rising edge of ECLK at time t9, shift registers 110 output signals u0 to u7 as signals s0 to s7, respectively. Thus, from time t9 until the next rising edge of ECLK at time t12, signal s0 is bit D0_0, signal s1 is bit D0_1, and so on, such that signal s7 is bit D0_7.

At time t10, control signal UPDATE_1 goes low, causing shift muxes 108 to output their lower data inputs to the data input ports D of shift registers 110.

From time t9 until the falling edge of ECLK at time t11, ECLK is high, causing output mux 114 to present signal s0 (i.e., bit D0_0) at output port TX_OUT. The falling edge of ECLK at time t11 triggers falling-edge register 112 to output signal s1 to the lower (0) data input of output mux 114. From time t11 until the rising edge of ECLK at time t12, ECLK is low, causing output mux 114 to present signal s1 (i.e., bit D0_1) at output port TX_OUT.

With UPDATE_1 low, the rising edge of ECLK at time t12 triggers shift registers 110 to output the lower data inputs of shift muxes 108 as signals s0 to s7. Thus, from time t12 until the next rising edge of ECLK at time t14, signal s6 is vss (e.g., logic 1), signal s4 is previous signal s6 (i.e., bit D0_6), signal s2 is previous signal s4 (i.e., bit D0_4), signal s0 is previous signal s2 (i.e., bit D0_2), signal s7 is vss, signal s5 is previous signal s7 (i.e., bit D0_7), signal s3 is previous signal s5 (i.e., bit D0S), and signal s1 is previous signal s3 (i.e., bit D0_3). Thus, from time t12 to time t13, ECLK is high, and output mux 114 presents signal s0 (now bit D0_2) at output port TX_OUT, and, from time t13 to time t14, ECLK is low, and output mux 114 presents signal s1 (now bit D0_3) at output port TX_OUT.

Similarly, with UPDATE_1 low, the rising edge of ECLK at time t14 triggers shift registers 110 to output the lower data inputs of shift muxes 108 as signals s0 to s7. Thus, from time t14 until the next rising edge of ECLK at time t16, signal s6 is vss, signal s4 is previous signal s6 (i.e., vss), signal s2 is previous signal s4 (i.e., bit D0_6), signal s0 is previous signal s2 (i.e., bit D0_4), signal s7 is vss, signal s5 is previous signal s7 (i.e., vss), signal s3 is previous signal s5 (i.e., bit D0_7), and signal s1 is previous signal s3 (i.e., bit DOS). Thus, from time t14 to time t15, ECLK is high, and output mux 114 presents signal s0 (now bit D0_4) at output port TX_OUT, and, from time t15 to time t16, ECLK is low, and output mux 114 presents signal s1 (now bit D0_5) at output port TX_OUT.

Lastly, with UPDATE_1 low, the rising edge of ECLK at time t16 triggers shift registers 110 to output the lower data inputs of shift muxes 108 as signals s0 to s7. Thus, from time t16 until the next rising edge of ECLK at time t19, signal s6 is vss, signal s4 is previous signal s6 (i.e., vss), signal s2 is previous signal s4 (i.e., vss), signal s0 is previous signal s2 (i.e., bit D0_6), signal s7 is vss, signal s5 is previous signal s7 (i.e., vss), signal s3 is previous signal s5 (i.e., vss), and signal s1 is previous signal s3 (i.e., bit D0_7). Thus, from time t16 to time t18, ECLK is high, and output mux 114 presents signal s0 (now bit D0_6) at output port TX_OUT, and, from time t18 to time t19, ECLK is low, and output mux 114 presents signal s1 (now bit D0_7) at output port TX_OUT.

In this way, serializer 100 converts eight parallel bits D0_0 to D0_7 into an 8-bit serial word D0<7:0>. This processing of serializer 100 repeats to serialize each successive set of eight parallel bits applied to input ports TX_DATA_0 to TX_DATA_7 into 8-bit serial words presented at output port TX_OUT. For example, at the rising edge of SCLK at time t6, the eight bits for word D1 are clocked into signals tx0 to tx7, and, at the rising edge of ECLK at time t9, those eight bits are clocked into signals u0 to u7, such that they are ready to be shifted out to output port TX_OUT starting at the rising edge of ECLK at time t19, thereby providing contiguous output of 8-bit serial data from one word to the next. As used herein, the term "contiguous" means that the timing between the last bit of one serialized word and the first bit of the next serialized word is the same as the timing between consecutive bits within each serialized word.

The flow of data from transfer registers 102 to update registers 106 corresponds to a domain crossing from the SCLK domain to the ECLK domain. In FIG. 3, for data word D0, this domain crossing occurs at time t3. Since time t3 is two ECLK cycles away from both the previous rising edge of SCLK at time t0 and the subsequent rising edge of SCLK at time t6, the timing of the domain crossing provides significant tolerance for skew between ECLK and SCLK that can result from different device sizes, different PVT (process, voltage, temperature) variations, and system jitter noise.

Note that, in 8:1 mode, control signal UPDATE_1 can be delayed to correspond to different ECLK pulses to produce slightly different implementations with different latencies, without changing the fundamental mechanism of serializer 100.

7:1 Gearing Ratio

Figure 4:
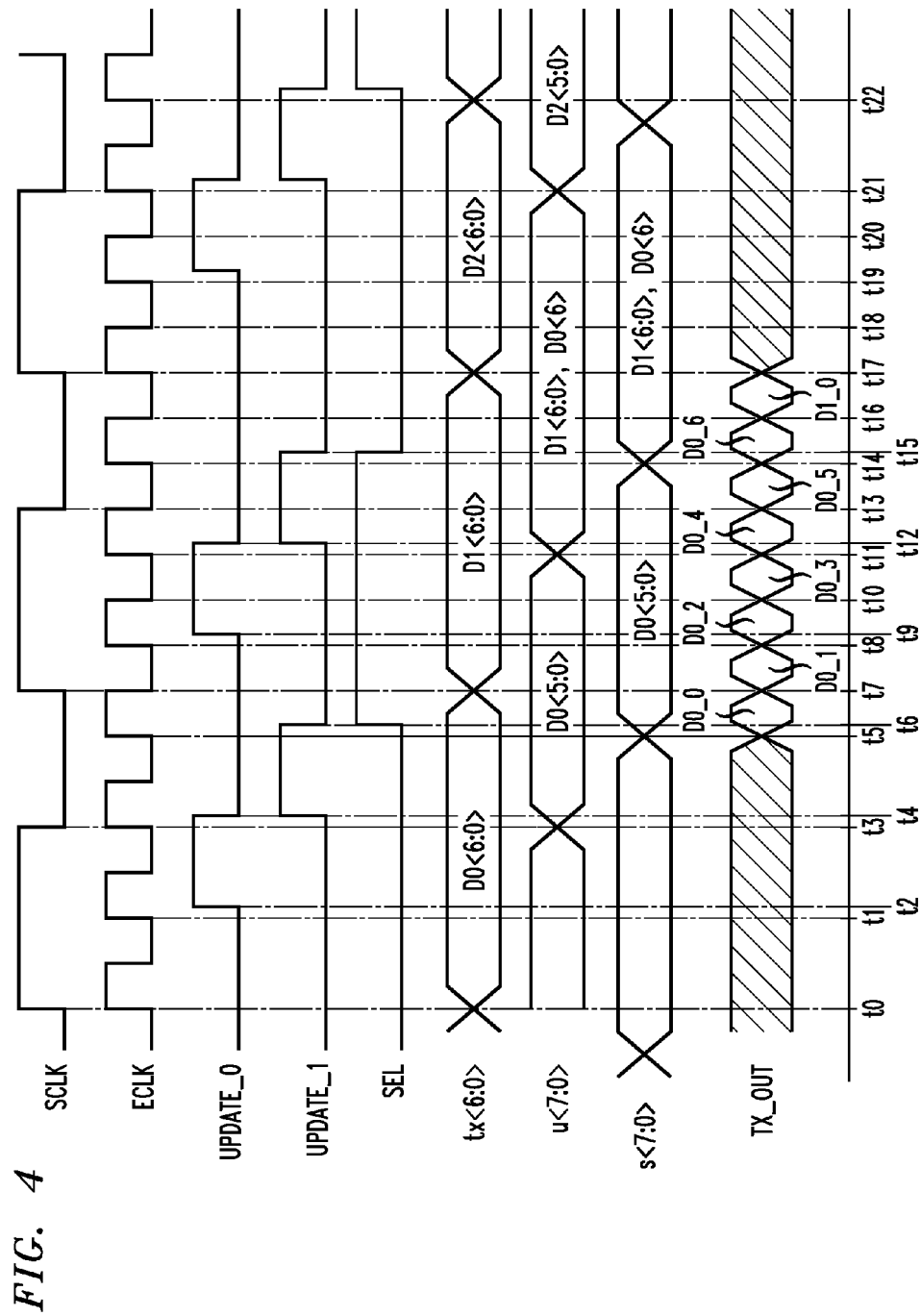
FIG. 4 shows a timing diagram representing some of the operations of the serializer of FIG. 1 when configured to operate as a 7:1 serializer.

FIG. 4 shows a timing diagram representing some of the operations of serializer 100 of FIG. 1 when configured to operate as a 7:1 serializer. FIG. 5 shows Table I, which identifies the values for certain control and data signals during some of the time periods represented in FIG. 4.

For a 7:1 gearing ratio, seven parallel data streams are respectively applied to only seven input ports TX_DATA_0 to TX_DATA_6 (input port TX_DATA_7 and transfer register 102_7 are not used), and the fast clock ECLK is only 3.5 times faster than the slow clock SCLK, as reflected in FIG. 3. Note that, although only seven transfer registers 102 are used for the 7:1 gearing ratio, all eight of the update muxes 104, update registers 106, shift muxes 108, and shift registers 110 are used, along with falling-edge register 112 and output mux 114, as described below.

To achieve the desired 7:1 gearing ratio, serializer 100 is essentially alternately toggled between a 6:1 mode and an 8:1 mode to achieve a net gearing ratio of 7:1. In particular, serializer 100 is initially operated in the 6:1 mode, such that bits D0_0 to D0_5 of the first 7-bit data word D0 are output as a 6-bit serial string. Serializer 100 is then operated in the 8:1 mode, such that bit D0_6 of the first data word D0 and bits D1_0 to D1_6 of the second 7-bit data word D1 are output as an 8-bit serial string. This toggling back and forth between the 6:1 mode and the 8:1 mode continues for each subsequent pair of consecutive 7-bit data words, thereby achieving a net gearing ratio of 7:1.

As represented in FIG. 4, and similar to the 8:1 gearing ratio of FIG. 3, the pulses in control signals UPDATE_0 and UPDATE_1 are slightly delayed relative to the corresponding rising edges in fast clock ECLK. Similarly, the pulses in control signal SEL are also slightly delayed relative to the corresponding rising edges in fast clock ECLK. Note that, in FIG. 4, in addition to being different from one another, the pulses in both UPDATE_0 and UPDATE_1 are not uniform in time. For both control signals, the second pulse in FIG. 4 occurs two ECLK cycles after the first pulse, while the third pulse occurs three ECLK cycles after the second pulse. This pattern repeats indefinitely, with the fourth pulse occurring two cycles after the third pulse, and the fifth pulse occurring three cycles after the fourth pulse, and so on.

This pattern of control signals UPDATE_0 and UPDATE_1, along with control signal SEL, is what toggles serializer 100 between the 6:1 mode and the 8:1 mode. In particular, when the rising edges of consecutive pulses of each of UPDATE_0 and UPDATE_1 are separated by three cycles of ECLK, there is time for serializer 100 to output six bits of serial data, and, when the rising edges of consecutive pulses of each of UPDATE_0 and UPDATE_1 are separated by four cycles of ECLK, there is time for serializer 100 to output eight bits of serial data.

In FIG. 4, time line tx<6:0> indicates the time periods at which the different parallel data words D0, D1, D2 reach the Q output ports of transfer registers 102, while time line u<7:0> indicates the time periods at which those parallel data words reach the Q outputs of update registers 106, time line s<7:0> indicates the time periods at which those parallel data words reach the Q outputs of shift registers 110, and time line TXOUT indicates the time periods at which the individual bits of the serialized data words reach output port TX_OUT.

At the first rising edge of SCLK at time t0 in FIG. 4, transfer registers 102_0 to 102_6 respectively output the seven parallel data bits D0_0 to D0_6 to the upper (0) data inputs of corresponding update muxes 104_0 to 104_6, which, with control signal SEL low, pass those seven data bits to the data input ports D of corresponding update registers 1060 to 106_6. Thus, from time t0 to the next rising edge of SCLK at time t7, signal tx0 in FIG. 1 is bit D0_0, signal tx1 is bit D0_1, and so on, such that signal tx6 is bit D0_6. Note that, since transfer register 102_7 is not used, signal tx7 is in a "don't care" state indicated in Table I by "*". Depending on the particular implementation, input port TX_DATA_7 could be tied to a power supply rail (e.g., ground or vss), in which case signal tx7 would have the same value as TX_DATA_7.

At the next rising edge of ECLK at time t1, control signal UPDATE_0 is low, and update registers 106 are therefore disabled. Control signal UPDATE_0 goes high at time t2, thereby enabling update registers 106. As such, at the next rising edge of ECLK at time t3, update registers 106 output their data bits to the upper (1) data inputs of their corresponding shift muxes 108. At time t4, control signal UPDATE_0 goes low, thereby disabling update registers 106. Thus, from time t3 until time t11, signal u0 in FIG. 1 is bit D0_0, signal u1 is bit D0_1, and so on, such that signal u6 is bit D0_6. Note that, during this time period, signal u7 will be set to the "don't care" signal from signal tx7.

Before time t4, control signal UPDATE_1 is low, causing shift muxes 108 to output their lower (0) data inputs. Thus, at the rising edge of ECLK at time t3, shift registers 110 output data appearing at the lower inputs of shift muxes 108. When operations of serializer 100 begin, these particular data values are irrelevant (i.e., "don't care").

At time t4, control signal UPDATE_1 goes high, causing shift muxes 108 to output their upper (1) data inputs (i.e., u0 to u7) to the data input ports D of shift registers 110. As such, at the next rising edge of ECLK at time t5, shift registers 110 output signals u0 to u7 as signals s0 to s7, respectively. Thus, from time t5 until the next rising edge of ECLK at time t8, signal s0 is bit D0_0, signal s1 is bit D0_1, and so on, such that signal s6 is bit D0_6. Note that signal s7 will be set to the "don't care" signal from signal u7.

At time t6, control signal UPDATE_1 goes low, causing shift muxes 108 to output their lower data inputs to the data input ports D of shift registers 110.

From time t5 until the falling edge of ECLK at time t7, ECLK is high, causing output mux 114 to present signal s0 (i.e., bit D0_0) at output port TX_OUT. The falling edge of ECLK at time t7 triggers falling-edge register 112 to output signal s1 to the lower (0) data input of output mux 114. From time t7 until the rising edge of ECLK at time t8, ECLK is low, causing output mux 114 to present signal s1 (i.e., bit D0_1) at output port TX_OUT.

With UPDATE_1 low, the rising edge of ECLK at time t8 triggers shift registers 110 to output the lower data inputs of shift muxes 108 as signals s0 to s7. Thus, from time t8 until the next rising edge of ECLK at time t11, signal s6 is vss, signal s4 is previous signal s6 (i.e., bit D0_6), signal s2 is previous signal s4 (i.e., bit D0_4), signal s0 is previous signal s2 (i.e., bit D0_2), signal s7 is vss, signal s5 is previous signal s7 (i.e., "don't care"), signal s3 is previous signal s5 (i.e., bit D0S), and signal s1 is previous signal s3 (i.e., bit D0_3). Thus, from time t8 to time t10, ECLK is high, and output mux 114 presents signal s0 (now bit D0_2) at output port TX_OUT, and, from time t10 to time t11, ECLK is low, and output mux 114 presents signal s1 (now bit D0_3) at output port TX_OUT.

Similarly, with UPDATE_1 low, the rising edge of ECLK at time t11 triggers shift registers 110 to output the lower data inputs of shift muxes 108 as signals s0 to s7. Thus, from time t11 until the next rising edge of ECLK at time t14, signal s6 is vss, signal s4 is previous signal s6 (i.e., vss), signal s2 is previous signal s4 (i.e., bit D0_6), signal s0 is previous signal s2 (i.e., bit D0_4), signal s7 is vss, signal s5 is previous signal s7 (i.e., vss), signal s3 is previous signal s5 (i.e., "don't care"), and signal s1 is previous signal s3 (i.e., bit D0S). Thus, from time t11 to time t13, ECLK is high, and output mux 114 presents signal s0 (now bit D0_4) at output port TX_OUT, and, from time t13 to time t14, ECLK is low, and output mux 114 presents signal s1 (now bit D0_5) at output port TX_OUT.

Returning to time t6, control signal SEL goes high, causing update muxes 104 to output their lower (1) data inputs to the data input ports D of update registers 106. The rising edge in slow clock SCLK at time t7 triggers transfer registers 102_0 to 102_6 to set signals tx0 to tx6 to bits D1_0 to D1_6, respectively, with signal tx7 remaining at "don't care".

At time t9, control signal UPDATE_0 goes high, thereby enabling update registers 106. As such, with control signal SEL still high, at the next rising edge of fast clock ECLK at time t11, update registers output the lower (1) data inputs of update muxes 104 as signals u1-u7. Thus, from time t11 to time t21, signal u6 is signal tx5 (i.e., bit D1_5), signal u4 is signal tx3 (i.e., bit D1_3), signal u2 is signal tx1 (i.e., bit D1_1), signal u0 is previous signal u6 (i.e., bit D0_6), signal u1 is signal tx0 (i.e., bit D1_0), signal u3 is signal tx2 (i.e., bit D1_2), signal u5 is signal tx4 (i.e., D1_4), and signal u7 is signal tx6 (i.e., bit D1_6).

At time t12, control signal UPDATE_0 goes low, thereby disabling update registers 106. At time t12, control signal UPDATE_1 goes high, causing shift muxes 108 to output their upper (1) data inputs to the data input ports D of shift registers 110.

At the rising edge of ECLK at time t14, with control signal UDPATE_1 high, shift registers 110 set signals s0-s7 to the signals applied to the upper (1) data inputs of shift muxes 108 (i.e., signals u0-u7, respectively). Thus, from time t14 to time t17, signal s6 is bit D1_5, signal s4 is bit D1_3, signal s2 is bit D1_3, signal s0 is bit D0_6, signal s1 is bit D1_0, signal s3 is bit D1_2, signal s5 is bit D1_4, and signal s7 is bit D1_6. Thus, from time t14 to time t16, ECLK is high, and output mux 114 presents signal s0 (now bit D0_6) at output port TX_OUT, and, from time t16 to time t17, ECLK is low, and output mux 114 presents signal s1 (now bit D1_0) at output port TX_OUT.

Control signal UPDATE_1 goes low at time t15, causing shift muxes 108 to output their lower (0) data inputs to the data input ports D of shift registers 110.

At the rising edge of ECLK at time t17, with control signal UDPATE_1 low, shift registers 110 set signals s0-s7 to the signals applied to the lower (0) data inputs of shift muxes 108. Thus, from time t17 to time t19, signal s6 is vss, signal s4 is previous signal s6 (i.e., bit D1_5), signal s2 is previous signal s4 (i.e., bit D1_3), signal s0 is previous signal s2 (i.e., bit D1_1), signal s1 is previous signal s3 (i.e., bit D1_2, signal s3 is previous signal s5 (i.e., bit D1_4), signal s5 is previous signal s7 (i.e., bit D1_6), and signal s7 is vss. Thus, from time t17 to time t18, ECLK is high, and output mux 114 presents signal s0 (now bit D1_1) at output port TX_OUT, and, from time t18 to time t19, ECLK is low, and output mux 114 presents signal s1 (now bit D1_2) at output port TX_OUT.

This data-shifting process at rising edges of ECLK continues until each of bits D1_3, D1_4, D1_5, and D1_6 are sequentially presented at output port TX_OUT.

Note, further, that, at time t17, the rising edge of slow clock SCLK triggers transfer registers 102_0 to 102_6 to set signals tx0 to tx6 to the next seven bits of parallel data (i.e., D2_0 to D2_6), as represented in FIG. 4 and Table I.

In this way, serializer 100 converts a first set of seven parallel bits D0_0 to D0_6 and a second set of seven parallel bits D1_0 to D1_6 into two contiguous 7-bit serial words D0<6:0> and D1<6:0>. This processing of serializer 100 repeats to serialize each successive pair of sets of seven parallel bits into two contiguous 7-bit serial words. In particular, note that, at the rising edge of SCLK at time t17, the seven bits for word D2 are clocked into signals tx0 to tx6, and, at the rising edge of ECLK at time t21, those bits are clocked into signals u0 to u7, such that they are ready to be shifted out to output port TX_OUT starting at the rising edge of ECLK at time t22, thereby providing contiguous output of 7-bit serial data from each pair of words to the next.

In FIG. 4, the SCLK-to-ECLK domain crossing for data word D0 occurs at time t3. Since time t3 is two ECLK cycles away from the previous rising edge of SCLK at time t0 and one and half ECLK cycles away from the subsequent rising edge of SCLK at time t7, like the domain crossing in FIG. 3, the timing of this domain crossing also provides significant tolerance for skew between ECLK and SCLK.

4:1 Gearing Ratio

Figure 6:
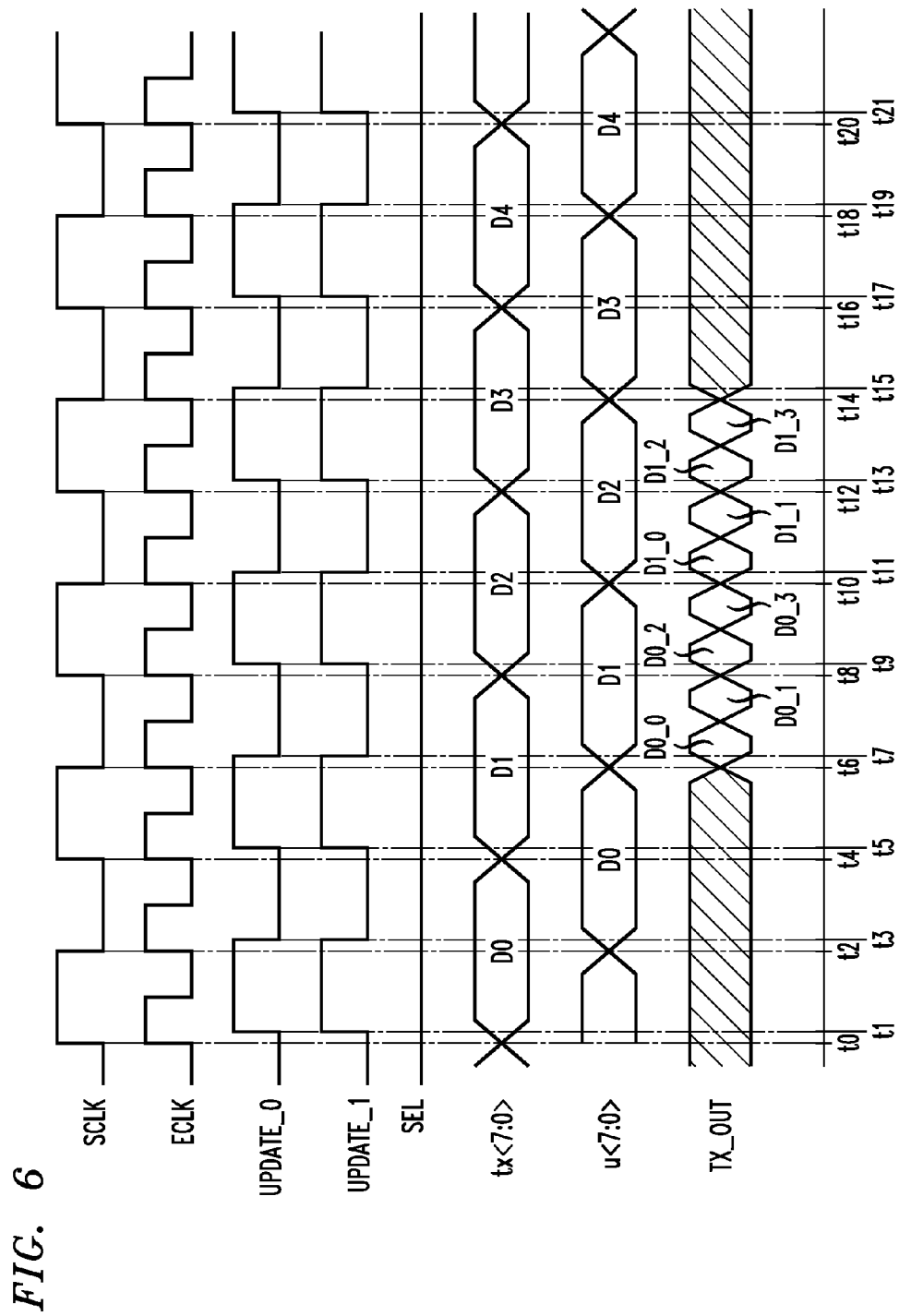
FIG. 6 shows a timing diagram representing some of the operations of the serializer of FIG. 1 when configured to operate as a 4:1 serializer.

FIG. 6 shows a timing diagram representing some of the operations of serializer 100 of FIG. 1 when configured to operate as a 4:1 serializer. For a 4:1 gearing ratio, four parallel data streams are respectively applied to only four input ports TX_DATA_0 to TX_DATA_3 (input ports TX_DATA_4 to TX_DATA_7 and transfer registers 102_4 to 102_7 are not used), and the fast clock ECLK is only two times faster than the slow clock SCLK, as reflected in FIG. 6. Note that, for the 4:1 gearing ratio, only four update muxes 104_0 to 104_3, only four update registers 106_0 to 106_3, only four shift muxes 108_0 to 108_3, and only three shift registers 110_0 to 110_3 are used, along with falling-edge register 112 and output mux 114. The other four update muxes 104_4 to 104_7, update registers 106_4 to 106_7, shift muxes 108_4 to 108_7, and shift registers 110_4 to 110_7 are not used.

Note that, for the first 4-bit data word D0, the first parallel data bit applied at the first input port TX_DATA_0 (i.e., bit D0_0) will become the first serial data bit presented at output port TX_OUT, the corresponding first parallel data bit applied at the second input port TX_DATA_1 (i.e., bit D0_1) will become the second serial data bit presented at output port TX_OUT, and so on, such that the corresponding first parallel data bit applied at the fourth input port TX_DATA_3 (i.e., bit D0_3) will become the fourth serial data bit presented at output port TX_OUT. This pattern for the first 4-bit data word D0 repeats for each successive 4-bit data word D1, D2, etc.

Given the detailed description of the operations of serializer 100 of FIG. 1 presented above for the 8:1 gearing ratio of FIG. 3 and the 4:1 timing diagram of FIG. 6, a person of ordinary skill in the would understand the operations of serializer 100 for the 4:1 gearing ratio.

In FIG. 6, the SCLK-to-ECLK domain crossing for data word D0 occurs at time t2. Since time t2 is one ECLK cycle away from both the previous rising edge of SCLK at time t0 and the subsequent rising edge of SCLK at time t4, like the domain crossings in FIGS. 3 and 4, the timing of this domain crossing also provides significant tolerance for skew between ECLK and SCLK.

Additional Configurations and Alternative Embodiments

Although not described in the context of specific timing diagrams, given the previous descriptions, a person of ordinary skill in the art would understand how to configure and operate serializer 100 for the other possible gearing ratios of 6:1, 5:1, 3:1, and 2:1. Furthermore, by designing serializers having the same general architecture as serializer 100, but with a sufficient number of additional registers and muxes at each stage, a person of ordinary skill in the art would, in theory, be able to implement serializers that can support any gearing ratio greater than 8:1.

Although the present invention has been described in the context of configurable serializers that can support a number of different gearing ratios, including at least one odd gearing ratio, the present invention can also be implemented as a non-configurable serializer having a fixed, odd gearing ratio.

Although the present invention has been described in the context of circuitry that uses flip-flops to store and forward data, those skilled in the art will understand that other types of sequential elements could be used instead of flip-flops, such as (without limitation) latches or memory.

Although the present invention has been described in the context of FPGAs, those skilled in the art will understand that the present invention can be implemented in the context of other types of programmable logic devices (PLDs), such as, without limitation, mask-programmable gate arrays (MPGAs), simple programmable logic devices (SPLDs), and complex programmable logic devices (CPLDs). More generally, the present invention can be implemented in the context of any kind of electronic device having programmable elements.

The present invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

We claim:

1. A serializer adapted to serialize N-bit parallel data, comprising:
   a transfer stage connected to transfer the N-bit parallel data from a relatively slow timing domain to a relatively fast timing domain;
   an update stage connected to receive parallel data from the transfer stage; and
   a serializing stage connected to convert parallel data received from the update stage into serial data having N-bit data words,
   wherein the update stage is configurable to cause the serializer to operate in at least an N−1 operating mode or an N+1 operating mode.

2. The invention of claim 1, wherein an N:1 gearing ratio is achieved by configuring the update stage to cause the serializer to alternately operate in the N−1 operating mode and the N+1 operating mode.

3. The invention of claim 1, wherein the serializer is a double-date rate (DDR) serializer.

4. The invention of claim 1, wherein the update stage is adapted to alternately forward (N−1) bits of parallel data and (N+1) bits of parallel data to the serializing stage to achieve an N:1 gearing ratio.

5. The invention of claim 1, wherein:
the transfer stage comprises a plurality of registers connected to process the N-bit parallel data based on a first clock signal;
the update stage comprises a plurality of registers connected to process the parallel data from the transfer stage based on a second clock signal faster than the first clock signal; and
the serializing stage comprises a plurality of registers connected to convert the parallel data from the update stage into the serial data based on the second clock signal.

6. The invention of claim 5, wherein the serializer further comprises a plurality of muxes connected to receive two input data bits from registers of the transfer stage and to present a selected output data bit to a register of the update stage.

7. The invention of claim 5, wherein the serializer further comprises at least one mux connected to receive one input data bit from a register of the update stage and another input data bit from a first register of the serializing stage and to present a selected output data bit to a second register of the serializing stage.

8. The invention of claim 1, wherein the serializer further comprises a controller adapted to generate:
a first control signal for controlling data transfer from the update stage;
a second control signal for controlling data transfer into the serializing stage; and
a third control signal for controlling whether (N−1) bits or (N+1) bits of parallel data are transferred from the update stage to the serializing stage.

9. The invention of claim 1, wherein the serializer is included within a programmable logic device.

10. A serializer adapted to serialize an N-bit parallel data stream, comprising:
a stage of transfer registers connected to process parallel data bits from the N-bit parallel data stream based on a first clock signal;
a stage of update registers connected to process parallel data bits from the stage of transfer registers based on a second clock signal, wherein the second clock signal is faster than the first clock signal; and
a stage of shift registers connected to convert parallel data bits from the stage of update registers into an outgoing serial data stream based on the second clock signal.

11. The invention of claim 10, wherein the stage of update registers is adapted to alternately forward (N−1) bits of parallel data and (N+1) bits of parallel data to the stage of shift registers to achieve an N:1 gearing ratio.

12. The invention of claim 10, wherein the serializer is a double-date rate (DDR) serializer.

13. The invention of claim 10, wherein the serializer further comprises a plurality of muxes connected to receive two input data bits from transfer registers and to present a selected output data bit to an update register.

14. The invention of claim 10, wherein the serializer further comprises at least one mux connected to receive one input data bit from an update register and another input data bit from a first shift register and to present a selected output data bit to a second shift register.

15. The invention of claim 10, wherein the serializer further comprises a controller adapted to generate:
a first control signal for controlling data transfer from the update registers towards the shift registers;
a second control signal for controlling shifting of data into the shift registers; and
a third control signal for controlling whether (N−1) bits or (N+1) bits of parallel data are transferred from the update registers to the shift registers.

16. A serializer adapted to serialize N-bit parallel data, comprising:
a first stage connected to receive parallel data; and
a second stage connected to convert parallel data received from the first stage into serial data having N-bit data words,
wherein an N:1 gearing ratio is achieved by configuring the first stage to cause the serializer to alternately operate in an N−1 operating mode and an N+1 operating mode.

17. The invention of claim 16, wherein the first stage is adapted to alternately forward (N−1) bits of parallel data and (N+1) bits of parallel data to the second stage to achieve an N:1 gearing ratio.

18. The invention of claim 16, wherein the serializer further comprises a controller adapted to generate:
a first control signal for controlling data transfer from the first stage;
a second control signal for controlling data transfer into the second stage; and
a third control signal for controlling whether (N−1) bits or (N+1) bits of parallel data are transferred from the first stage to the second stage.

19. The invention of claim 16, wherein the first stage includes update registers connected to process parallel data bits and the second stage includes shift registers connected to convert parallel data bits from the update registers into an outgoing serial data stream.

20. The invention of claim 16, wherein the second stage comprises:
a plurality of first shift registers triggered by one edge of a clock signal;
a second shift register connected to receive an output of a first shift register and triggered by the other edge of the clock signal; and
a mux having a first input connected to receive an output of another first shift register, a second input connected to receive an output of the second shift register, and third input connected to receive the clock signal, the output from the mux controlled by the levels of the clock signal.

* * * * *